(12) United States Patent
Fitzgerald (10) Patent No.: US 9,530,763 B2
(45) Date of Patent: Dec. 27, 2016

(54) MONOLITHIC INTEGRATION OF CMOS AND NON-SILICON DEVICES

(71) Applicant: Massachusetts Institute of Technology, Cambridge, MA (US)

(72) Inventor: Eugene A. Fitzgerald, Windham, NH (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 14/390,560

(22) PCT Filed: Apr. 4, 2013

(86) PCT No.: PCT/US2013/035249
§ 371 (c)(1),
(2) Date: Oct. 3, 2014

(87) PCT Pub. No.: WO2013/152176
PCT Pub. Date: Oct. 10, 2013

(65) Prior Publication Data
US 2015/0099328 A1    Apr. 9, 2015

Related U.S. Application Data

(60) Provisional application No. 61/619,971, filed on Apr. 4, 2012.

(51) Int. Cl.
*H01L 25/00*    (2006.01)
*H01L 21/762*   (2006.01)
*H01L 21/8258*  (2006.01)

(52) U.S. Cl.
CPC ......... *H01L 25/50* (2013.01); *H01L 21/76251* (2013.01); *H01L 21/8258* (2013.01); *H01L 2924/0002* (2013.01)

(58) Field of Classification Search
CPC ................ H01L 25/50; H01L 21/8258; H01L 21/76251; H01L 2924/0002; H01L 2924/00
See application file for complete search history.

(56) References Cited

U.S. PATENT DOCUMENTS

| | | |
|---|---|---|
| 4,818,728 A | 4/1989 | Rai et al. |
| 5,236,118 A | 8/1993 | Bower et al. |
| 5,346,848 A | 9/1994 | Grupen-Shemansky et al. |
| 5,407,856 A | 4/1995 | Quenzer et al. |

(Continued)

FOREIGN PATENT DOCUMENTS

JP    10-256154 A    9/1988

OTHER PUBLICATIONS

International Search Report and Written Opinion issued on Jul. 15, 2013, in the International application No. PCT/US13/35246 filed on Apr. 4, 2013, 10 pages.

(Continued)

*Primary Examiner* — Michelle Mandala
(74) *Attorney, Agent, or Firm* — Wolf, Greenfield & Sacks, P.C.

(57) ABSTRACT

A method includes attaching a partially processed CMOS wafer to a second wafer to produce a combined wafer. The second wafer comprises a first region including a material different from silicon. The method also includes forming devices in the first region or in a second region of the combined wafer having a material different from silicon.

20 Claims, 8 Drawing Sheets

(56) References Cited

U.S. PATENT DOCUMENTS

| | | |
|---|---|---|
| 5,849,627 A | 12/1998 | Linn et al. |
| 6,261,859 B1 | 7/2001 | Ouchi |
| 6,455,398 B1 * | 9/2002 | Fonstad et al. ............... 438/459 |
| 6,677,655 B2 | 1/2004 | Fitzergald |
| 7,126,212 B2 | 10/2006 | Enquist et al. |
| 7,535,089 B2 | 5/2009 | Fitzgerald |
| 7,727,806 B2 | 6/2010 | Uhland et al. |
| 7,915,645 B2 | 3/2011 | Briere |
| 7,994,550 B2 | 8/2011 | Kaper et al. |
| 8,012,592 B2 | 9/2011 | Fitzgerald |
| 8,014,451 B2 | 9/2011 | Suh |
| 8,048,766 B2 | 11/2011 | Joly et al. |
| 8,106,381 B2 | 1/2012 | Atanackovic |
| 8,120,060 B2 | 2/2012 | Fitzgerald |
| 8,178,914 B2 | 5/2012 | Levine et al. |
| 8,242,510 B2 | 8/2012 | Hebert |
| 2006/0252229 A1 | 11/2006 | Joly et al. |
| 2007/0105262 A1 | 5/2007 | Birner et al. |
| 2010/0218819 A1 | 9/2010 | Farmer et al. |
| 2011/0165707 A1 | 7/2011 | Lott et al. |
| 2012/0175636 A1 | 7/2012 | Ihara |
| 2012/0223367 A1 | 9/2012 | Kittler et al. |
| 2012/0270378 A1 | 10/2012 | Kittler et al. |
| 2012/0305992 A1 | 12/2012 | Marino et al. |

OTHER PUBLICATIONS

Extended European Search Report dated Aug. 31, 2015 for Application No. 13773070.1.

\* cited by examiner

MONOLITHIC INTEGRATION OF CMOS AND NON-SILICON DEVICES

CROSS-REFERENCE TO RELATED APPLICATIONS

This application is a U.S. National Stage Application of International Application PCT/US2013/035249 filed Apr. 4, 2013 and claims priority to U.S. provisional application No. 61/619,971, titled "PROCESS AND BUSINESS METHODS FOR CREATING NOVEL MONOLITHIC CIRCUITS WITH NEW MATERIALS," filed Apr. 4, 2012, both of which are hereby incorporated by reference in their entirety.

BACKGROUND

1. Field of Invention

The techniques described herein relate to the integration of CMOS circuitry (e.g., formed in silicon) with non-silicon materials and devices.

2. Discussion of the Related Art

The digital revolution has been driven by Moore's Law, that mixed technical and economic law in which there is a net power-law driving force which approximately doubles the transistor density in silicon integrated circuits over approximately a 18-24 month time period. The fuel for this trend has been a mixture of increased technical performance, lower cost, and increased market application as the transistor density has increased. The trend started in the 1960's, but is maturing today. One reason the trend is maturing is power limits prevent easily reducing the size of transistors. Another reason is that increasing the density of standard devices, i.e., PMOSFETs and NMOSFETs, does not create as many new market applications and segments as previously accomplished in the heart of the Moore's Law paradigm years ago.

It has been anticipated for approximately three decades that eventually new materials would be incorporated into silicon CMOS circuits. The inventor has previous experience in the beginning of bringing such innovation to the marketplace, which initiated with the introduction of strained silicon into digital MOS circuits. However, such innovation was accomplished with the insertion of a new element into mainstream silicon CMOS manufacturing: Ge. The time, cost, and return on intimately integrating a new material into current advanced CMOS production facilities is a major limitation for introducing new, monolithically formed materials and devices into silicon CMOS circuits.

In a previous invention by the present inventor, a special engineered substrate was constructed that could be inserted into the beginning of the silicon CMOS process. This substrate contained a buried template layer that could withstand the temperature of a modified CMOS process. After the front-end high temperature steps for the CMOS process are completed, the template can be exposed and III-V device epitaxy can be initiated, then processed, and finished with the CMOS back-end processing, thus producing a monolithic circuit.

SUMMARY

Some embodiments relate to a method that includes attaching a partially processed CMOS wafer to a second wafer to produce a combined wafer. The second wafer includes a first region including a material different from silicon. The method also includes forming devices in the first region or in a second region of the combined wafer having a material different from silicon.

Some embodiments relate to method that includes performing partial CMOS processing on a semiconductor wafer using a CMOS process to produce a partially processed CMOS wafer having transistors formed therein. The method also includes removing the partially processed CMOS wafer from the CMOS process. The method also includes receiving a combined wafer comprising at least a portion of the partially processed CMOS wafer having the transistors and a device region having a material different from silicon in which devices are formed. The method further includes performing further CMOS processing on the combined wafer. The CMOS process may be a conventional CMOS process.

Some embodiments relate to an apparatus as described herein.

Some embodiments relate to a product formed using a process as described herein.

The foregoing summary is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques and devices described herein.

DETAILED DESCRIPTION

In some embodiments, the techniques described herein can obviate the need for a special engineered wafer to enter a silicon CMOS fabrication facility. In some embodiments, the techniques described herein can obviate the need for modifying relatively mature silicon CMOS processing. These factors lower the barrier to create novel monolithic integrated circuits having both silicon CMOS devices and other devices formed of materials that are incompatible with current CMOS manufacturing processes.

Figure 1:
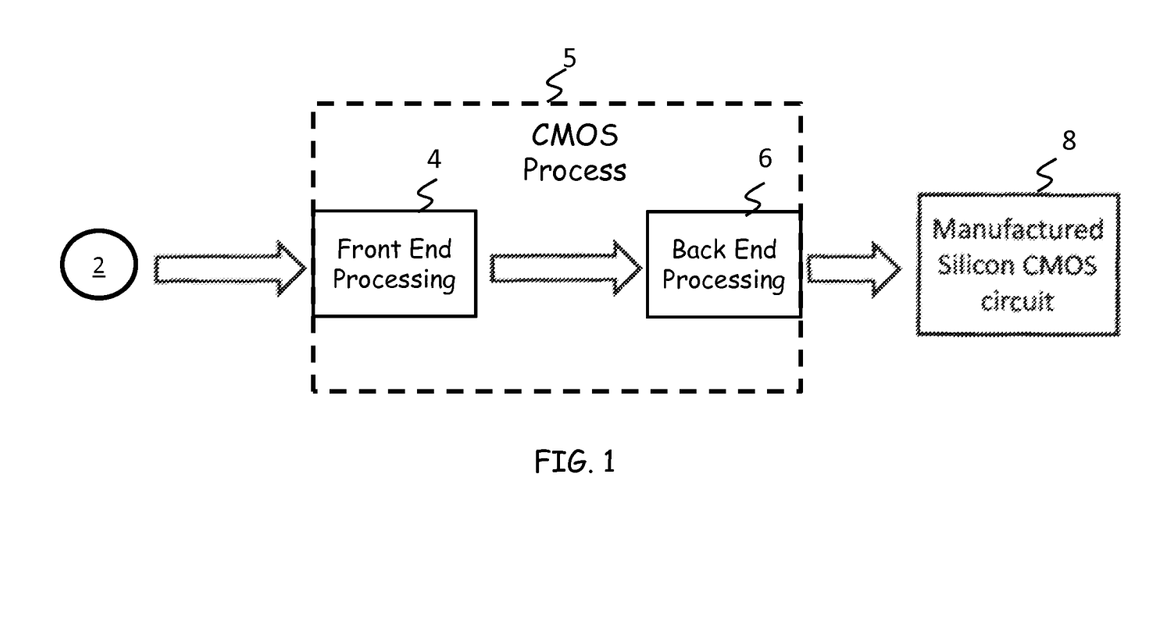
FIG. 1 shows a block diagram of a conventional CMOS process.

FIG. 1 shows a diagram of a conventional silicon CMOS process 5 as performed in a conventional CMOS foundry. The CMOS process 5 begins with the introduction of a semiconductor wafer 2, such as a silicon or SOI (silicon-on-insulator) wafer. In a conventional silicon CMOS process 5, "front end" processing 4 is performed, followed by "back end" processing 6. Front end processing 4 generally includes a variety of process steps for the formation of transistors in the semiconductor wafer 2, such as the formation of source, drain, and gate regions. Front end processing 4 may include the formation of dielectric layer(s) over the gate, drain and source regions. Front end processing 4 may include the formation of plugs (e.g., tungsten plugs) to contact the source, gate and/or drain regions. However, front end processing 4 is not required to include the formation of such dielectric layer(s) and/or plugs, as they may be part of back end processing 6. Following front end processing 4, back end processing 6 is performed to form interconnections between the transistors. A plurality of interconnect layers may be formed and patterned. The completion of CMOS processing produces a manufactured silicon CMOS circuit 8.

Substantial investment has been made in the industry toward the development of conventional silicon CMOS processes. As a result, todays CMOS processes are highly developed and are optimized to produce silicon CMOS circuits with high yield and low cost per chip. A conventional CMOS process is performed in a specialized semiconductor fabrication facility, known as a CMOS foundry. Significant care is taken in a CMOS foundry to ensure that contaminants and impurities which may reduce yield are not introduced into the process. Non-standard semiconductor materials, such as III-V or II-VI semiconductor materials, are either not allowed or substantial modification to the standard CMOS process is required to accommodate them. Today's CMOS foundries require an investment on the order of billions of dollars to begin production, which provides a high barrier to entry, thus discouraging the development of CMOS processes compatible with the introduction of non-silicon materials. Front end processing is particularly sensitive, as it involves very high temperature steps which may not be tolerated by III-V or II-VI semiconductor materials.

The techniques described herein enable monolithically integrating CMOS devices with devices formed of other materials, including non group IV semiconductor materials such as III-V and/or II-VI semiconductor materials, that are not compatible with current CMOS processes. In some embodiments, a semiconductor wafer may be partially processed in a CMOS process (e.g., a front end process) to form transistors. The partially-processed CMOS wafer can be removed from the CMOS process and attached to a separate template wafer including a layer of a material different from silicon, such as a III-V or II-VI semiconductor material, for example. A device layer of a material different from silicon, including non group IV semiconductor materials such as III-V and/or II-VI semiconductor materials, can be processed to form devices therein, such as electronic and/or optoelectronic devices. The combined wafer can then be re-introduced into a CMOS process for the completion of CMOS processing (e.g., back-end processing). In some embodiments, conventional CMOS processing is used to produce silicon CMOS devices on the same chip as other devices formed of a non-silicon material. In some embodiments, no modification to the conventional CMOS process 5 is needed, thus providing compatibility with existing CMOS processes and foundries. This compatibility with existing CMOS processes and foundries lowers the barrier to entry for non-standard material and devices to be integrated with CMOS electronics.

As will be discussed, the nature of the non-standard material and devices sought to be incorporated with CMOS electronics may affect the point at which a partially processed CMOS wafer is removed from a CMOS process, as different materials and devices can have different thermal budgets. The process flow may be determined based on five thermal budgets to ensure that none of them is exceeded: the thermal budget of the new material template and the new device layers, the thermal budget of the partially-processed silicon CMOS wafer, the thermal budget of the integration bonding process, and the thermal budget of the epitaxial device layer deposition. The ordering of the template, device layer deposition, and device processing may be determined by the various thermal budgets. The highest thermal budgets may be at the start of the process, with the lowest at the end of the process.

Figure 2:
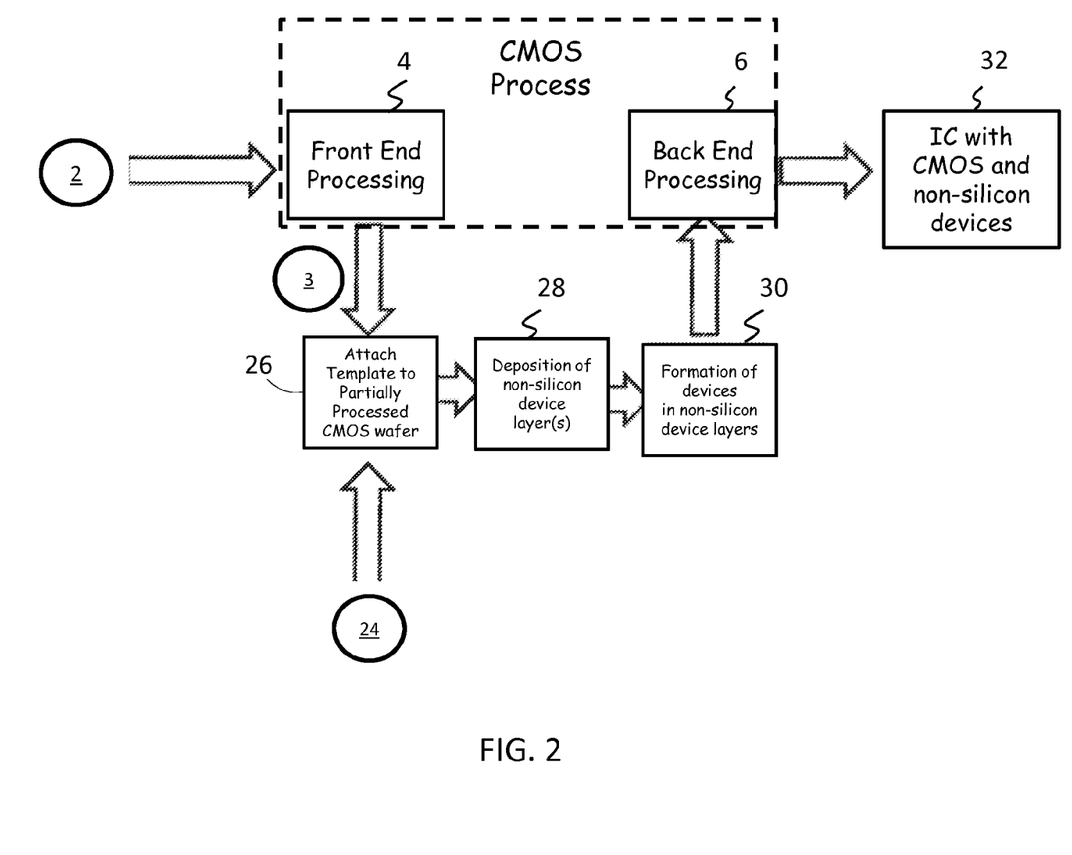
FIG. 2 shows a block diagram of a process for forming CMOS circuitry integrated with non-silicon materials and/or devices, according to some embodiments.
Figure 3A:
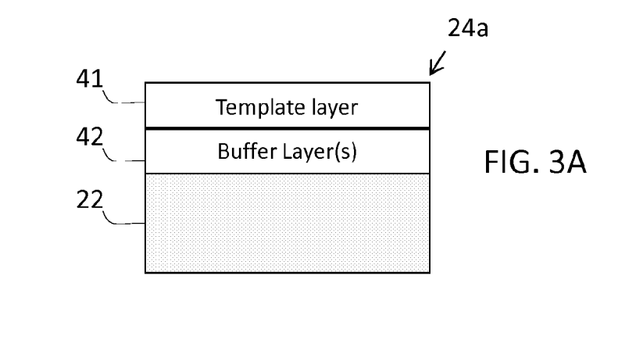
FIG. 3A-3C show exemplary template wafers, according to some embodiments.
Figure 3B:
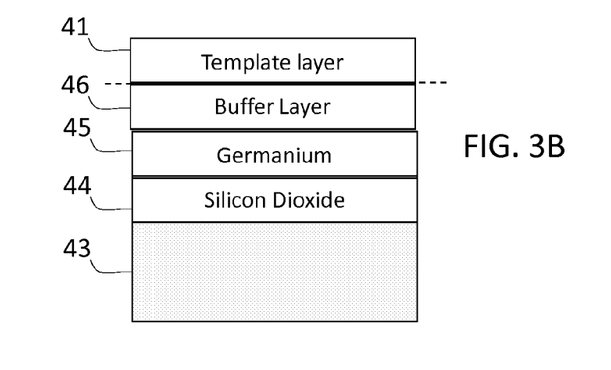
Figure 3C:
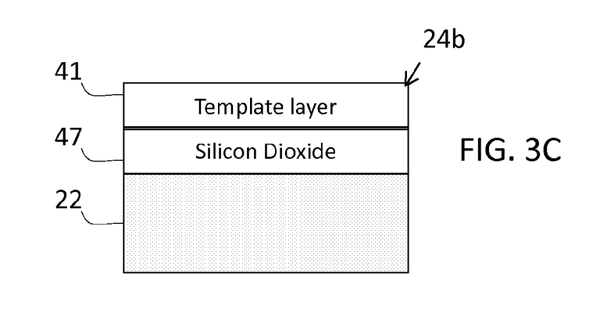

A first embodiment is described herein with respect to FIGS. 2-4 illustrating the integration of InGaAs materials and devices, for example, with CMOS electronics. A second embodiment is described herein with respect to FIGS. 5-6 illustrating the integration of GaN materials and devices, for example, CMOS electronics.

FIG. 2 shows a block diagram of a process for forming CMOS circuitry integrated with non-silicon materials and/or devices, according to some embodiments. In the embodiment of FIG. 2, the formation of device layers is performed following the attaching of a partially-processed CMOS wafer with a template wafer. In some embodiments, the process flow illustrated in FIG. 2 may be used for the integration of materials and devices that may not withstand the attaching of the partially-processed CMOS wafer with a template wafer (i.e., due to the temperature at which such a step is performed). In some embodiments, the process flow of FIG. 2 may be used to integrate silicon CMOS devices with devices at least partially formed in InGaAs. However, the techniques described herein are not limited in this respect, as the process flow of FIG. 2 may be used for other materials besides InGaAs.

As shown in FIG. 2, a template wafer 24 may be provided. In some embodiments, template wafer 24 includes a template layer having a template material different from silicon. In some embodiments, the template material may be a semiconductor material having a lattice constant different from that of relaxed silicon. Such a lattice constant may enable the template material to provide a more suitable epitaxial template for the subsequent deposition of non-silicon semiconductor device layer(s) than would be provided by silicon. In some embodiments, the template material may be a semiconductor material different from a group IV semiconductor material, such as a III-V semiconductor material and/or a group II-IV semiconductor material, for example.

In an embodiment in which a subsequently-formed device layer includes InGaAs, the template material may include a III-V semiconductor material, such as AlInAs, for example, with a lattice constant that is more closely matched to the lattice constant of InGaAs than is silicon. The template material may be chosen such that it has a higher thermal budget than InGaAs and/or is capable of withstanding a higher temperature process than InGaAs, which may enable the template material to withstand a high-temperature process of attaching the template wafer with a partially processed CMOS wafer. The device layers, which may comprise an InGaAs layer, may not be deposited on the AlInAs template layer at this stage since their thermal budget in this particular embodiment is not greater than the thermal budget of the step of attaching the template wafer with a partially processed CMOS wafer, and therefore the device layers would not survive such as step. Further discussion regarding exemplary techniques and materials for producing a template wafer 24 is provided below with reference to FIG. 3.

Separately, as shown in FIG. 2, a semiconductor wafer 2 such as an Si or SOI wafer may be partially processed in a silicon CMOS process. In some embodiments, an SOI wafer may be used for semiconductor wafer 2 since the buried oxide layer can be used as an etch-stop for subsequent silicon substrate removal. In some embodiments, front end processing 4 is performed on the semiconductor wafer 2, which may include the formation of device regions such as source, gate and/or drain regions. The CMOS process may continue until the point where the remaining thermal budget of the CMOS process steps is greater than or equal to the thermal budget of attaching process 26 in which a partially processed CMOS wafer 3 is attached to the template wafer 24. At this point, the partially-processed CMOS wafer 3 may be removed from the CMOS process, as illustrated in FIG. 2.

The partially-processed CMOS wafer 3 may then be attached to template wafer 24 in an attaching process 26. In some embodiments, attaching process 26 may include wafer bonding of the partially processed CMOS wafer 3 to the template wafer 24. However, the techniques described herein are not limited to wafer bonding, as any suitable process may be used for attaching the partially processed CMOS wafer 3 to the template wafer 24.

Following the attaching of the partially processed CMOS wafer 3 to the template wafer 24, processing may commence for the deposition of non-silicon device layer(s) on the template layer and the formation of non-silicon devices therein. Prior to depositing the device layer(s), windows may be formed in the CMOS device layer to expose the template layer. In deposition step 28, the device layer(s) may then be formed on and/or above the template layer through the windows in the CMOS device layer. Any suitable process may be used for forming the device layer(s), such as epitaxy, for example. In an embodiment in which a device layer includes an InGaAs material, device layers including InGaAs and/or AlInGaAs may be deposited on and/or above the template layer. The device layer(s) may have precision doping and thickness that are optimal for device operation.

After the device layer deposition, a device formation processes 30 may be performed to process the non-silicon device layer(s) to form devices therein, such as electronic or optoelectronic devices, for example. In some embodiments, process 30 may include processing the wafer so that it can be re-inserted into a CMOS process.

As illustrated in FIG. 2, the wafer may then be re-inserted into a CMOS process. In some embodiments, the wafer may be re-inserted into the CMOS processes at the same point the partially processed CMOS wafer 3 was removed from the CMOS process. For example, if the partially processed CMOS wafer 3 was removed from the CMOS process after the completion of front end processing 4, the combined wafer may be reintroduced into the CMOS process after the device formation step 30 at the beginning of the back end processing 6. Back end processing 6 is then performed on the combined wafer. As discussed above, performing back end processing 6 may include forming interconnects, for example. Any suitable number of levels of interconnects may be formed. In some embodiments, such interconnects may connect the silicon CMOS electronics and the devices formed in the non-silicon device layer(s). Accordingly, an integrated circuit 32 is created having both CMOS electronics and non-silicon devices.

Exemplary template wafers and wafer processing for the embodiment of FIG. 2 is illustrated in FIGS. 3A-3C and FIGS. 4A-4J.

FIG. 3A illustrates an example of a template wafer 24a, according to some embodiments. As shown in FIG. 3A, template wafer 24a may include a semiconductor substrate 22, such as a silicon substrate, for example (e.g., a silicon wafer). Engineering steps can be performed on the semiconductor substrate 22 to form overlying semiconductor layer(s) with a lattice constant different from that of the semiconductor substrate 22, thereby enabling the formation of a low-defect density template layer 41. For example, a graded buffer layer 42 of graded composition may be formed on the semiconductor substrate 22 to gradually transition from a lattice constant of the semiconductor substrate 22 to another lattice constant more closely matched to that of the material forming template layer 41. A non-silicon material may be formed on the graded buffer layer 42 as the template layer 41. For example, in embodiments in which an InGaAs device layer may be formed over the template layer 41, the template layer 41 may be formed of AlInAs. However, the material of the template layer 41 is not limited to AlInAs, as any suitable material having a suitable lattice constant may be used.

As illustrated in FIG. 3B, in some embodiments an initial substrate of GOI (germanium-on-insulator) can be the initial substrate for the deposition of a buffer layer 46 including a compositionally graded layer of AlInAs, graded to a larger lattice constant. FIG. 3B shows a GOI substrate having a thin germanium layer 45 on a layer of silicon dioxide 44 on a silicon substrate 43. As illustrated in FIG. 3C, a template wafer 24b may be formed by transferring a high quality AlInAs layer formed on the buffer layer 46 to a semiconductor wafer 22 (e.g., a silicon wafer) coated with silicon dioxide 47. Such a transfer may be performed through any suitable process including standard processes, such as epitaxial lift-off, ion implantation and exfoliation, or simply bonding and substrate dissolution. The high quality AlInAs layer may then serve as a template layer 41 for the deposition of a device layer of another semiconductor material, such as InGaAs, for example. In some embodiments, if an AlInAs template layer 41 is used, the AlInAs template layer can be terminated with an optional thin strained GaAs layer formed thereon such that the formation of the device layers) through epitaxy is facilitated.

The techniques described herein are not limited as to particular materials for template wafer 24. Further, the techniques described herein are not limited as to particular engineering steps for the formation for the formation of template 24 on substrate 22. In some embodiments, template wafer 24 may be formed without the use of a substrate 22 and/or a buffer layer. For example, in some embodiments the template wafer 24 may be an entire wafer formed of a suitable template material (e.g., AlInAs).

In some embodiments, the template wafer 24 may be the same diameter as the semiconductor wafer 2 processed in the CMOS process (and thus the same diameter as the partially-processed CMOS wafer 3). However, the techniques described herein are not limited in this respect, as in some embodiments wafers of different sizes may be used. In some embodiments, the template wafer 24 may be 200 mm or greater in diameter to facilitate being attached to a semiconductor wafer 2 compatible with sufficiently advanced silicon MOSFET technology. In some embodiments, the template wafer may have the same or smaller diameter than the diameter of an advanced silicon MOSFET technology wafer.

In some embodiments, a wafer may have a generally circular shape. However, the techniques described herein are not limited in this respect, as the wafers described herein may have any suitable shape.

FIGS. 4A-4J shows a process flow diagram illustrating wafer processing that may be performed in connection with an embodiment as illustrated in FIG. 2.

Figure 4A:
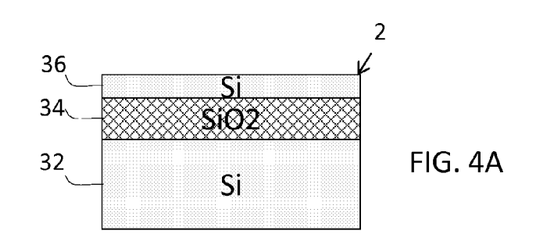
FIG. 4A-4J illustrate exemplary wafer processing that may be performed in the process of FIG. 2.
Figure 5:
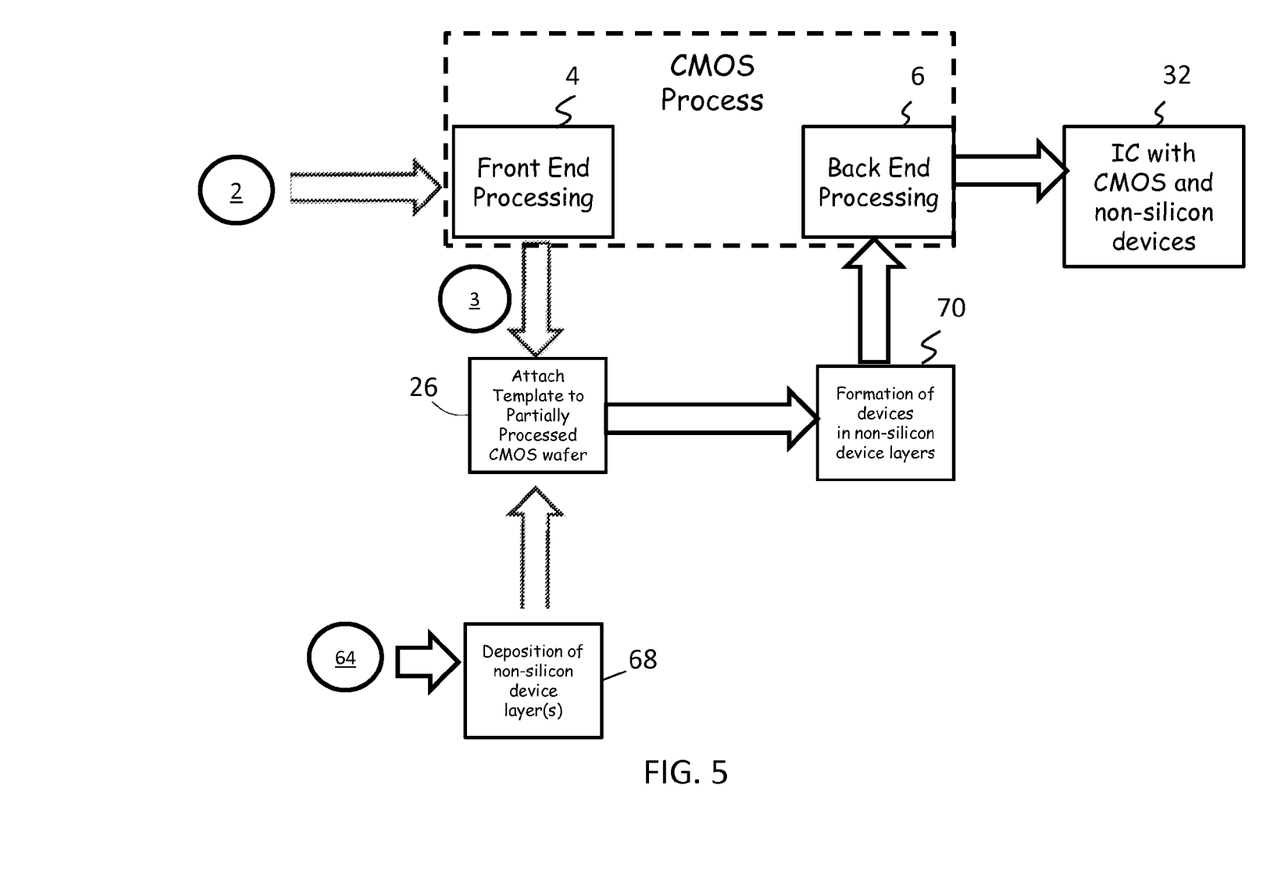
FIG. 5 shows a block diagram of a process for forming CMOS circuitry integrated with non-silicon materials and/or devices, in which a device layer is formed prior to attaching a template wafer to a partially processed CMOS wafer, according to some embodiments.

FIG. 4A shows an example of a semiconductor wafer 2 prior to the start of CMOS processing. In the example of FIG. 4A, wafer 2 is an SOI wafer having a silicon substrate 32, an insulator layer 34 (e.g., $SiO_2$), and a silicon device layer 36. However, the techniques described herein are not limited to the use of an SOI wafer, as in some embodiments wafer 2 may be a silicon wafer or another type of wafer compatible with a conventional CMOS process.

Figure 4B:
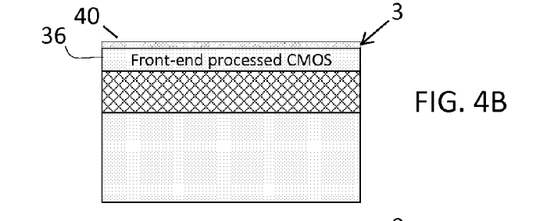
Figure 4C:
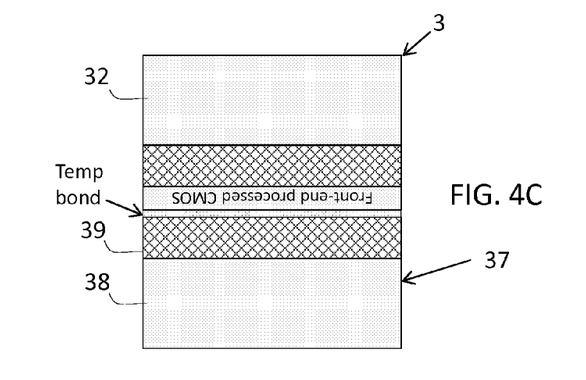

As discussed above, the wafer 2 may be inserted into a front-end CMOS process 4. FIG. 4B illustrates a partially processed CMOS wafer 3 following removal from the front-end CMOS process 4. As illustrated, the device layer 36 has been processed in a front-end CMOS process and can include semiconductor device regions, such as source, drain and/or gate regions, for example. Optionally, prior to removal from the CMOS process, the device layer 36 may have formed therein vias or plugs to contact the regions of the semiconductor devices formed therein. Prior to or after removal from the CMOS process, the partially processed CMOS wafer 3 may be terminated with an oxide-based material 40 formed thereon which can be planarized for bonding. This planarized surface of the partially-processed CMOS wafer 3 may then be bonded to a temporary handle wafer, as illustrated in FIG. 4C As shown in FIG. 4C, the partially processed CMOS wafer 3 may be flipped over and temporarily attached to a handle wafer 37 (e.g., by wafer bonding). In this embodiment, handle wafer 37 includes a semiconductor substrate 38 (e.g., Si) and an oxide layer 39 (e.g., $SiO_2$). The oxide layer 39 may be planarized prior to bonding. In some embodiments, a relatively strong bond between the handle wafer 37 and the partially processed CMOS wafer 3 may be formed by performing the bonding process at an elevated temperature, e.g., greater than or equal to 450 degrees C. Alternatively, a temporary low temperature bond can be used to bond the partially processed CMOS wafer 3 to the handle wafer 37. The advantage of this type of temporary bond is that no thermal budget is used. However, the techniques described herein are not limited in these respects, as techniques other than wafer bonding may be used to attach the handle wafer 37 to the partially processed CMOS wafer 3, as the techniques described herein are not limited to wafer bonding the handle wafer 37 to the partially processed CMOS wafer 3.

Figure 4D:
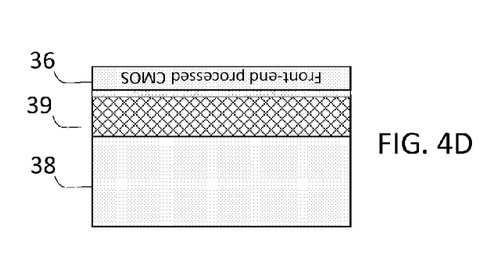

As illustrated in FIG. 4D, following the attachment of the handle wafer 37 to the partially processed CMOS wafer 3, the majority or the entirety of the original substrate 32 may be removed, leaving the partially processed CMOS device layer 36 attached (upside down) to the temporary handle wafer. As illustrated in FIG. 4D, the original back-side of the partially processed CMOS device layer 36 is now face-up, and this surface may be terminated with a planarized oxide layer 31 for subsequent bonding to the template wafer 24.

Figure 4E:
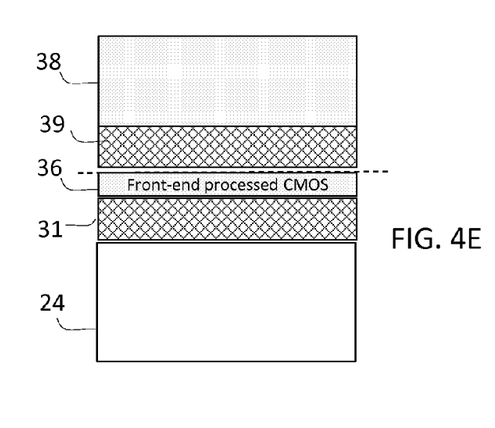

As illustrated in FIG. 4E, the CMOS-on-handle wafer shown in FIG. 4D may then be attached to the template wafer 24. In an embodiment in which an InGaAs device layer is formed and an AlInAs template later is used, the AlInAs template wafer may be terminated with a planarized oxide that may be bonded to the planarized oxide 31 of the CMOS-on-handle wafer. To form a strong bond, in some embodiments the oxide-oxide bond may be annealed to 450-800 degrees C. In some embodiments, techniques other than wafer bonding may be used to join the template wafer 24 to the partially processed CMOS wafer 3, as the techniques described herein are not limited to wafer bonding. In an embodiment as illustrated in FIG. 2, since the device layers will be formed subsequently to the step of attachment of the template wafer 24 to the partially processed CMOS wafer 3, in some embodiments the temperature of the attachment step may be equal to or greater than the temperature of the step in which the device layer(s) are formed.

Figure 4F:
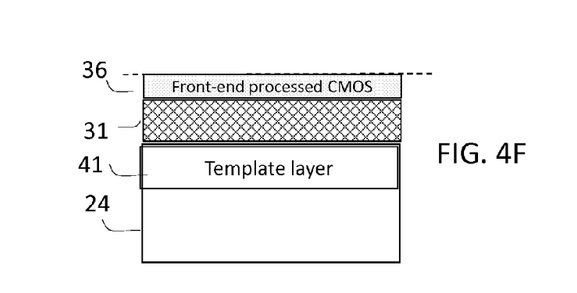

The handle wafer 37 can then be removed, as illustrated in FIG. 4F. Any suitable technique may be used for removing the handle wafer 37. For example, the handle wafer 37 may be dissolved in a selective etch process, such as KOH, TMAH, or an EDP etch. In some embodiments, if a temporary bond is used in the CMOS-on-handle wafer process, the handle substrate may be removed at low temperature, and then the oxide-oxide bond may be annealed afterwards.

As shown in FIG. 4F, the resulting structure has a partially processed silicon CMOS layer 36 on top of an oxide layer 31 on a template wafer 24 having a template layer 42.

Figure 4G:
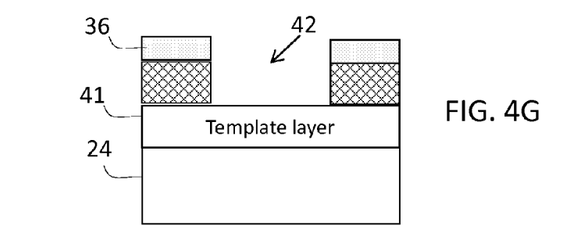
Figure 4H:
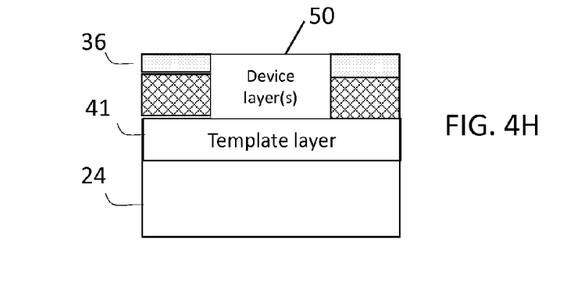

The step 28 (see FIG. 2) of forming non-silicon device layer(s) may then proceed with the formation of one or more window(s) 42 in the device layer 36 and its underlying oxide layer, as shown in FIG. 4G. Device layer(s) of non-silicon material may then be formed within the window(s) 42. For example, as shown in FIG. 4H, device layers 50 including, for example, InGaAs and/or AlInGaAs, may be deposited on the template layer 4. In some embodiments, the upper surface of the device layer(s) 50 may be coplanar with or substantially coplanar with the upper surface of the CMOS device layer 36, which may facilitate subsequent wafer processing.

Figure 4I:
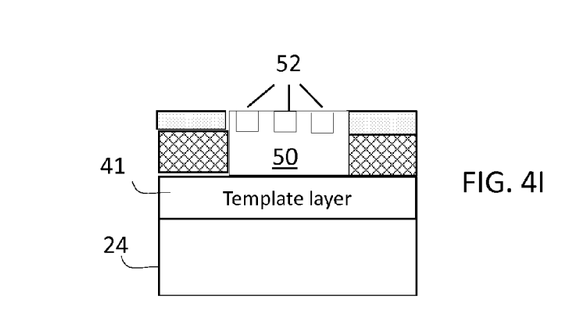

As shown in FIG. 4I, in step 30 (see FIG. 2), the formation of devices 52, such as electronic and/or optoelectronic devices, may be performed within the device layer(s) 50. Any suitable techniques may be used for forming devices in the device layers(s) 50, such as those known in the art. In some embodiments, steps 28 and/or 30 may be performed according to techniques described in U.S. Pat. No. 8,012,592 by the present inventor, which is hereby incorporated by reference in its entirety.

Figure 4J:
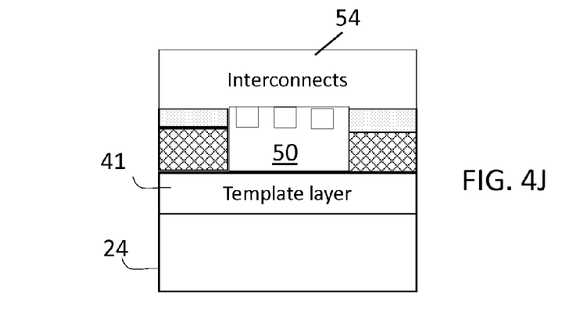

As illustrated in FIG. 2 and FIG. 4J, the combined wafer may then be re-introduced into the CMOS process for completion of CMOS processing. For example, if the partially processed CMOS wafer 3 was removed from the CMOS process following front end processing, the wafer may be re-inserted into the CMOS process for back end CMOS processing 6, following non-silicon device formation step 30. FIG. 4J illustrates that back end processing may be performed to form interconnects 54. As mentioned above, such interconnects may connect the silicon CMOS devices and the devices formed in the non-silicon device layers.

Above has been described an embodiment in which a step 28 of forming device layers is performed subsequent to a step 26 of attaching a partially processed CMOS wafer to a template wafer. However, in some embodiments, the forming of device layers may be performed prior to the step of attaching the partially processed CMOS wafer to another wafer having a non-silicon material. Such an embodiment, illustrated in FIG. 5, may be used to integrate GaN devices, for example, with silicon CMOS electronics. GaN device layers in some cases may survive the high temperatures of a step of attaching the partially processed CMOS wafer 3 to another wafer. In some cases, the optimal temperature for depositing the GaN device layer(s) may be too high for the thermal budget of the partially processed CMOS wafer 3. Accordingly, in some embodiments, the forming of GaN device layers may be performed prior to the step of attaching the partially processed CMOS wafer to another wafer having a non-silicon material.

FIG. 5 shows a block diagram of a process for forming CMOS circuitry integrated with non-silicon materials and/or devices, in which a device layer is formed prior to attaching a template wafer to a partially processed CMOS wafer, according to some embodiments. As shown in FIG. 5, a template wafer 64 may be provided. In some embodiments, the template wafer 64 may have a template material of a lattice constant suitable for subsequent deposition of a non-silicon device layer, such as GaN, for example. In the case of GaN, a GaN/AlGaN series of layers may be used as the template material. The layer(s) of template material may be deposited generally at different temperatures and sequences than the GaN and/or AlGaN device layers. However, the techniques described herein are not limited in these respects, as any suitable template materials, combinations of layers and deposition techniques may be used. In step 68, the deposition of the device layer (e.g., GaN) may be performed. Following the deposition of the device layer, the template wafer with the device layer formed thereon is attached to a partially processed CMOS wafer 3 to form a combined wafer in step 26. Windows may then be opened in the CMOS device layer to expose the non-silicon device layer (e.g., GaN). In step 70, processing is performed to form non-silicon devices in the non-silicon device layer. Any of a variety of suitable devices may be formed therein, such any one or more of a field effect transistor, light emitting diode, or laser, for example. Further processing may be performed to form contacts to the non-silicon devices, which may be at a level of the wafer below the level of the CMOS device layer. As discussed above, following the formation of non-silicon devices, the wafer may be re-inserted into a CMOS process for the completion of CMOS processing.

Figure 6A:
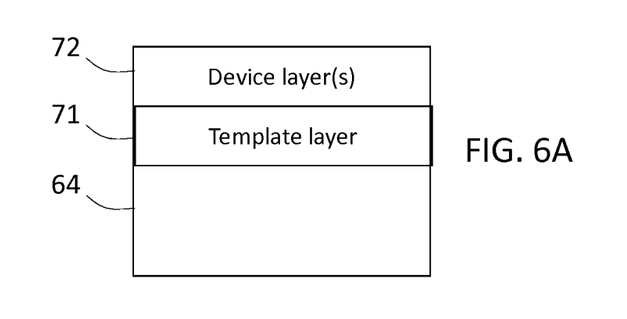
FIG. 6A-6F illustrates exemplary wafer processing that may be performed in the process of FIG. 5.
Figure 6B:
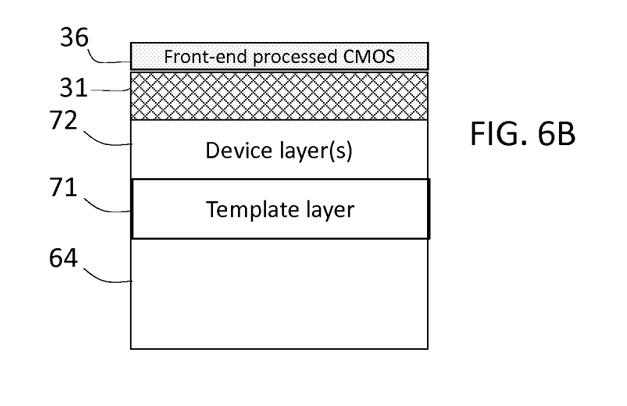
Figure 6C:
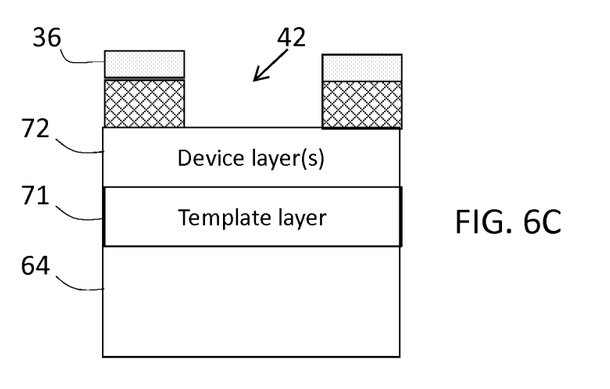
Figure 6D:
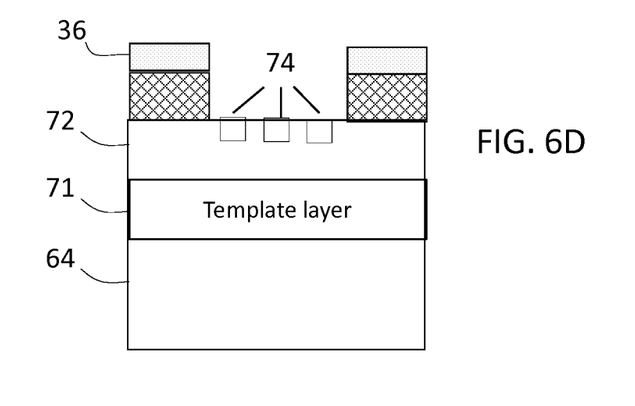
Figure 6E:
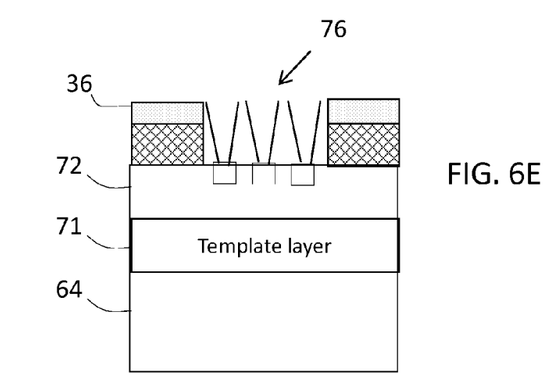
Figure 6F:
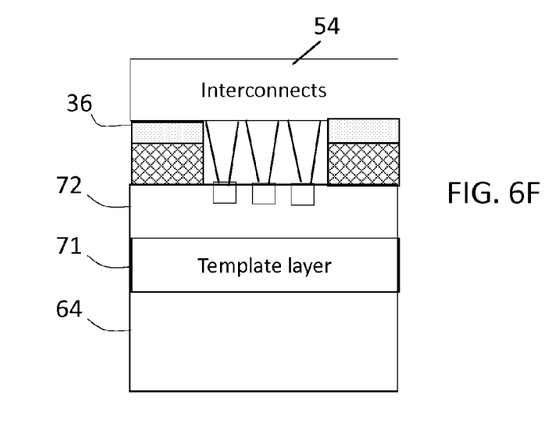

FIG. 6A shows an example of a template wafer 64 having a template layer 71 and a device layer 72 formed thereon. The template wafer with the device layer 72 may be attached to a partially processed CMOS wafer using any suitable technique, such as those discussed above. FIG. 6B illustrates the combined wafer following the step of attachment and removal of any handle substrate. As illustrated in FIG. 6C, windows 42 may be formed in the CMOS device layer to expose the non-silicon device layer(s) 72. FIG. 6D shows that non-silicon devices 74 may be formed in the non-silicon device layer 72. As mentioned above, non-silicon devices 74 may any suitable types of devices, such as electronic and/or optoelectronic devices. As shown in FIG. 6E, vias or plugs 76 may be formed to make contact to the non-silicon devices 74. As discussed above, the wafer may be re-inserted into the CMOS process for back end CMOS processing, following non-silicon device formation step 70. FIG. 6F illustrates that back end processing may be performed to form interconnects 54.

According to the techniques described herein, it is possible to form non-standard materials and devices in conjunction with standard silicon CMOS fabrication facilities. Previously, innovation in this area is difficult or not possible due to the disruptive nature of integrating new materials into a mature silicon fabrication facility. To ramp development and production of a variety of new processes involving new materials and devices, such as III-V devices for example, is high-risk and disruptive to the current business method of silicon manufacturing. The techniques described herein can leverage the mature and stable CMOS manufacturing process while integrating non-standard materials and devices with CMOS electronics, thereby creating new market opportunities without requiring prohibitive levels of investment.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A method, comprising:
attaching a partially processed CMOS wafer to a second wafer to produce a combined wafer, the partially processed CMOS wafer having been partially processed in no more than a portion of a CMOS process prior to the attaching of the partially processed CMOS wafer to the second wafer, wherein the partially processed CMOS wafer comprises a device region including transistors, wherein the second wafer comprises a silicon substrate, a first region comprising a material different from silicon disposed over the silicon substrate, and at least one intermediate region between the silicon substrate and the first region, wherein the attaching of the partially processed CMOS wafer to the second wafer is performed such that the combined wafer has the first region positioned between the device region of the partially-processed CMOS wafer and the silicon substrate;
forming devices in the first region or in a second region of the combined wafer comprising a material different from silicon; and
after forming the devices and attaching the partially processed CMOS wafer to the second wafer, and in a CMOS process, forming interconnects that interconnect the transistors of the device region and interconnects that extend laterally over the device region to interconnect the transistors of the device region and the devices of the first or second region.

2. The method of claim 1, wherein the device region comprises silicon and the transistors are formed in a CMOS process.

3. The method of claim 1, wherein attaching the partially processed CMOS wafer to the second wafer comprises wafer bonding the partially processed CMOS wafer to the second wafer.

4. The method of claim 1, wherein the devices are formed in the second region, wherein the second wafer is a template wafer, and wherein the first region comprises a template material including a non group IV semiconductor material.

5. The method of claim 4, wherein the non group IV semiconductor material includes a group III-V semiconductor material.

6. The method of claim 5, wherein the group III-V semiconductor material comprises an AlInAs material.

7. The method of claim 1, further comprising receiving the partially processed CMOS wafer from a CMOS foundry.

8. The method of claim 1, wherein forming the devices comprises forming electronic and/or optoelectronic devices.

9. The method of claim 1, wherein the second wafer is a template wafer, and wherein the first region comprises a template material, wherein the method further comprises:
   forming the second region over the template material as a device region,
   wherein the devices are formed in the device region.

10. The method of claim 9, wherein the second region is formed after attaching the partially processed CMOS wafer to the second wafer.

11. The method of claim 9, wherein the second region includes a non group IV semiconductor material.

12. The method of claim 11, wherein the non group IV semiconductor material includes a group III-V semiconductor material.

13. The method of claim 12, wherein the group III-V semiconductor material comprises an InGaAs material and/or an AlInGaAs material.

14. The method of claim 1, wherein the devices are formed in the first region.

15. The method of claim 14, wherein the devices are formed in the first region prior to attaching the partially processed CMOS wafer to the second wafer.

16. The method of claim 14, wherein the first region comprises a GaN material.

17. The method of claim 1, further comprising forming the partially processed CMOS wafer in a front end CMOS process.

18. A method, comprising:
   performing partial CMOS processing on a semiconductor wafer using a CMOS process to produce a partially processed CMOS wafer having transistors formed in a CMOS device region of the partially processed CMOS wafer;
   removing the partially processed CMOS wafer from the CMOS process;
   receiving a combined wafer in which the partially processed CMOS wafer is bonded to a second wafer, the combined wafer comprising at least a portion of the partially processed CMOS wafer having the transistors, the second wafer comprising a second device region comprising a material different from silicon in which devices are formed, a silicon substrate, and at least one intermediate region between the second device region and the silicon substrate, wherein the second device region is positioned between the CMOS device region and the silicon substrate; and
   performing further CMOS processing on the combined wafer after receiving the combined wafer, the further CMOS processing comprising forming interconnects between the transistors of the CMOS device region and interconnects that extend laterally over the CMOS device region to interconnect the transistors of the CMOS device region and the devices of the second device region.

19. The method of claim 18, wherein the CMOS device region is a silicon device region.

20. The method of claim 18, wherein the material different from silicon comprises a group III-V semiconductor material.

* * * * *